United States Patent [19]

Dunnican

[11] Patent Number: 4,628,255
[45] Date of Patent: Dec. 9, 1986

[54] AGC TECHNIQUE FOR SPECTRUM ANALYZERS

[75] Inventor: William O. Dunnican, Pompton Plains, N.J.

[73] Assignee: The United States of America as represented by the Secretary of the Navy, Washington, D.C.

[21] Appl. No.: 889,854

[22] Filed: Dec. 8, 1969

[51] Int. Cl.⁴ .......................................... G01R 23/165
[52] U.S. Cl. ................... 324/77 C; 324/77 CS
[58] Field of Search .............. 330/129, 132; 324/77 C, 324/77 CS

[56] References Cited

U.S. PATENT DOCUMENTS 2,403,982  7/1946  Koenig .............................. 324/77 X
2,996,667  8/1961  Galbreath .......................... 324/77

Primary Examiner—Theodore M. Blum
Assistant Examiner—Mack Hellner
Attorney, Agent, or Firm—Robert W. Adams

[57] ABSTRACT

An automatic gain control system is disclosed which utilizes a voltage controlled vario-losser means to vary the AGC System output. The control voltage is derived from the lowest detected level from any of a plurality of narrow band pass filters, such as the monolithic crystal type now available, each of which has a different peak transmittance frequency which is close to but different from a frequency of interest.

5 Claims, 3 Drawing Figures

AGC TECHNIQUE FOR SPECTRUM ANALYZERS

BACKGROUND OF THE INVENTION

This invention relates to spectrum analyzers such as are used in studying sea noise spectra, and more particularly to improvements in the AGC (automatic gain control) of sea noise spectrum analyzers, for example analyzers of the lofar (low frequency analyzer and recorder) type.

Signals received at underwater hydrophones generally include broadband noises due to wind and wave action, shipping flow noise, and seismic disturbances. Also present are discrete frequencies from marine propulsion machinery. A representative spectrum has a smooth background level with some peaks of discrete frequencies, the background level being substantially of the character of white noise.

When a spectrum analyzer output with widely varying spectral densities is presented on a limited dynamic display medium, an automatic gain control is needed. Traditionally, lofar analysis has been displayed on "Timefax" electrosensitive paper which has a very limited range of approximately 6 db.

Since a lofar spectrum may have a range of 40 db across the frequency band of interest, a stiff AGC is required to maintain the output within the 6 db range of the display medium. In a typical lofar spectrum analyzer with AGC, the AGC filter bandwidth is about 50 times the analyzing bandwidth, that is 10 Hz vs 0.2 Hz, and the AGC stiffness is about 1 db change of the output for a 15 db change of the input. Now, a strong signal within the AGC filter bandwidth causes a decrease in gain throughout the AGC filter bandwidth and hence a "whitening" of the recorded spectrum response on the electrosensitive paper about the strong signal to the width of the AGC filter. If weak signals are present at frequencies falling in the area of whitening, they will not be displayed. One prior art approach to overcoming the problem of whitening is found in U.S. Pat. No. 2,996,667 issued to R. R. Galbreath.

Recent improvements in filter techniques have made available narrow band pass filter devices such as monolithic crystal filters which are considerably more stable than filters obtainable before and which are more discriminating in their band pass characteristics.

SUMMARY OF THE INVENTION

It is a principle object of the present invention to provide improved automatic gain control for a spectrum analyzer system, which gain control will improve detection of weaker, discrete frequency signals when they occur near stronger signals which would cause conventional AGC means to preclude detection of such weaker signals.

Another object of the invention is to provide an AGC system utilizing a plurality of narrow band pass filters each having a different band pass frequency, a detector following each of the filters, and means for selecting the detector output having the lowest level as the input to a feedback amplifier, the output of which controls the ohmic resistance of a vario-losser through which the signal to be analyzed is passed.

BRIEF DESCRIPTION OF THE DRAWINGS

Other objects and advantages of automatic gain controls embodying the present invention will become apparent when read in conjunction with the accompanying sheets of drawings, in which.

DESCRIPTION OF THE PREFERRED EMBODIMENT

Figure 1:
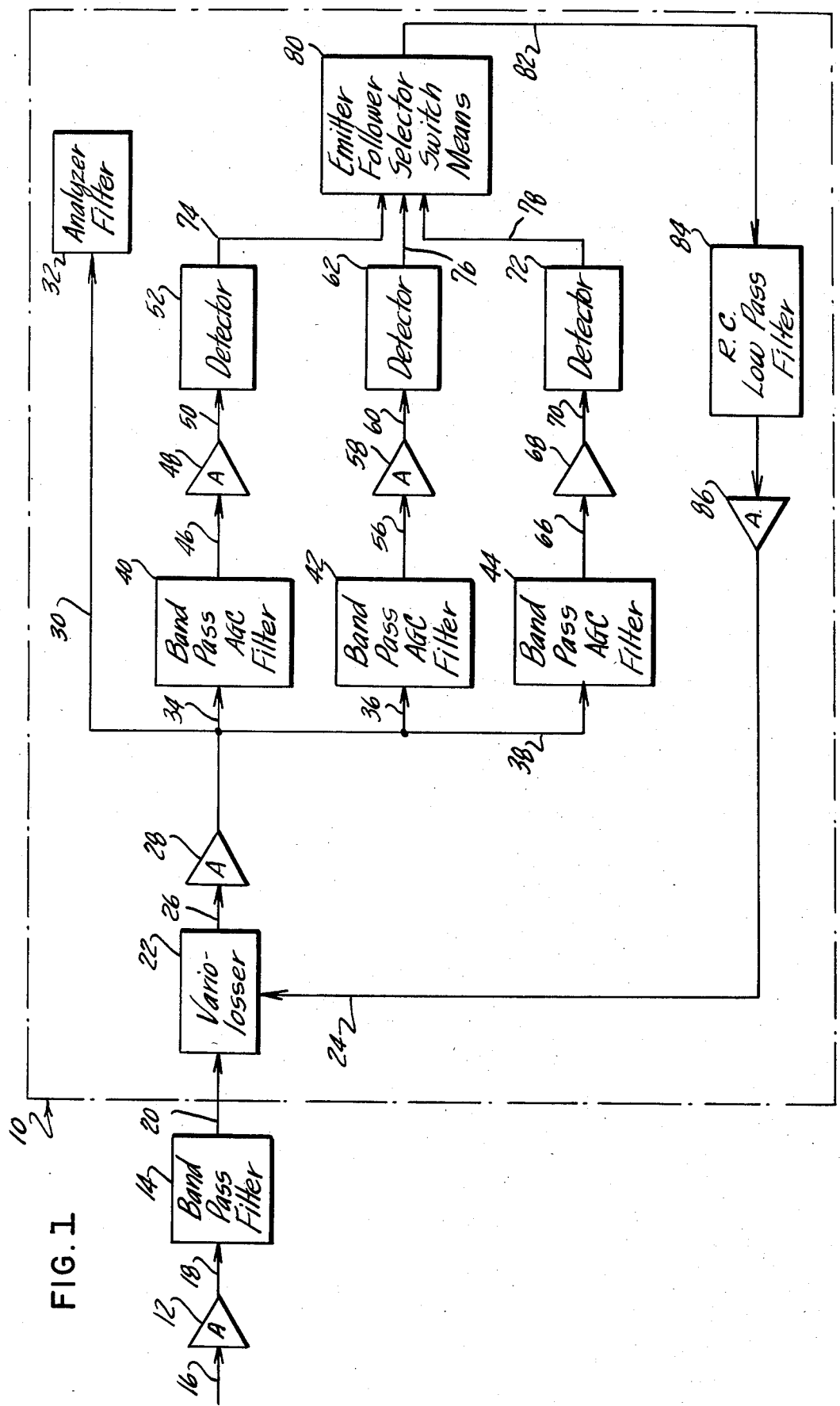
FIG. 1 is a diagrammatic illustration in block form of an automatic gain control system embodying the present invention.

In the form of the invention illustrated in the drawings and described hereinafter, there is provided an AGC system generally indicated at 10, which system is particularly suited to use in a spectrum analyzer of the lofar type. Such analyzers are generally well known. Accordingly, only an RF (radio frequency) amplifier 12 and band pass filter 14 thereof which precede the AGC system 10 are illustrated. The RF amplifier 12 receives a modulated signal via line 16, which signal, in this example, will be considered to consist of the low or base band frequency spectrum such as sea noise mixed with a carrier frequency of about 15 MHz derived from a stepped frequency oscillator (not shown).

The mixed signal is amplified by the RF amplifier 12 and passed as shown by line 18 to the band pass filter 14. In this example the filter 14 has a band pass width of approximately 220 KHz, which is about 15 Hz with reference to the base band. The output of the filter 14 on line 20 is applied as the input to the AGC system 10 which is the subject of this invention.

The AGC system 10 comprises a diode vario-losser means 22 which receives the output of the filter 14 and attenuates it in response to a control voltage on line 24. The control voltage is varied in accordance with the strength of the background level of a portion of the spectrum passed by the filter 14. The output of the vario-losser means 22 on line 26 is applied to an RF amplifier 28. The output of the AGC system 10 is taken from the RF amplifier 28 on line 30 for application to an analyzer filter 32 of the spectrum analyzer of which the AGC system forms a part. The filter 32, in accordance with the present example, has a central frequency of 15.0407 MHz and a bandwidth of 3.0 KHz.

The output of the RF amplifier 28 is also applied, via lines 34, 36, and 38 to a plurality of narrow band pass AGC filters 40, 42, and 44 having peak transmittances at 14.979 MHz, 15.056 MHz, and 15.102 MHz, respectively. These filters are preferably of the monolithic crystal type. The bandwidth of each of the filters 40, 42, and 44 is 15 KHz, which is 1 Hz when referenced to the base band, and they are located at about −4 Hz, +1 Hz, and +4 Hz with respect to the analyzing filter center frequency.

The output of filter 40 is connected as shown via line 46 to an RF amplifier 48 which in turn has its output connected via line 50 to a detector 52. Similarly, the output of filter 40 is connected as shown by line 56 to an RF amplifier 58 which in turn has its output connected via line 60 to a detector 62, while the output of filter 44 is connected via line 66 to an RF amplifier 68 which is in turn connected via line 70 to a detector 72.

The outputs of the detectors 52, 62, and 72 are applied as shown by lines 74, 76, and 78 to a three input, unity gain, electronic selector switch 80. The switch 80, which is described hereinafter in more detail selects for its voltage output on line 82, the input with the lowest voltage level.

Because the selector switch 80 picks the input with the lowest level, the signal appearing on line 82 does not exhibit high noise peaks, but instead is a D.C. voltage with a noise-like ripple of approximately 0.4 volts peak-to-peak amplitude. The reference numeral 84 designates a simple, RC, low pass filter that reduces the ripple by a factor of approximately ten. The amount of smoothing that can be introduced is limited by an opposing objective that requires the AGC to follow variations in the spectrum shape. Component values may be chosen for the filter 84 to provide adequate smoothing of the AGC control voltage and yet permit it to follow background changes of more than 10 dB in any given 10 Hz segment of the spectrum.

A differential amplifier 86 is located between the filter 84 and the vario-losser 22 to provide D.C. gain, AGC output level control, and a stable low impedance driving source for the vario-losser diodes.

Since the output voltage on line 82 is a function of the lowest input level to the switch 80, strong signals located simultaneously in any two of the AGC filters 40, 42, and 44 will not affect the AGC voltage on line 24.

Figure 2:
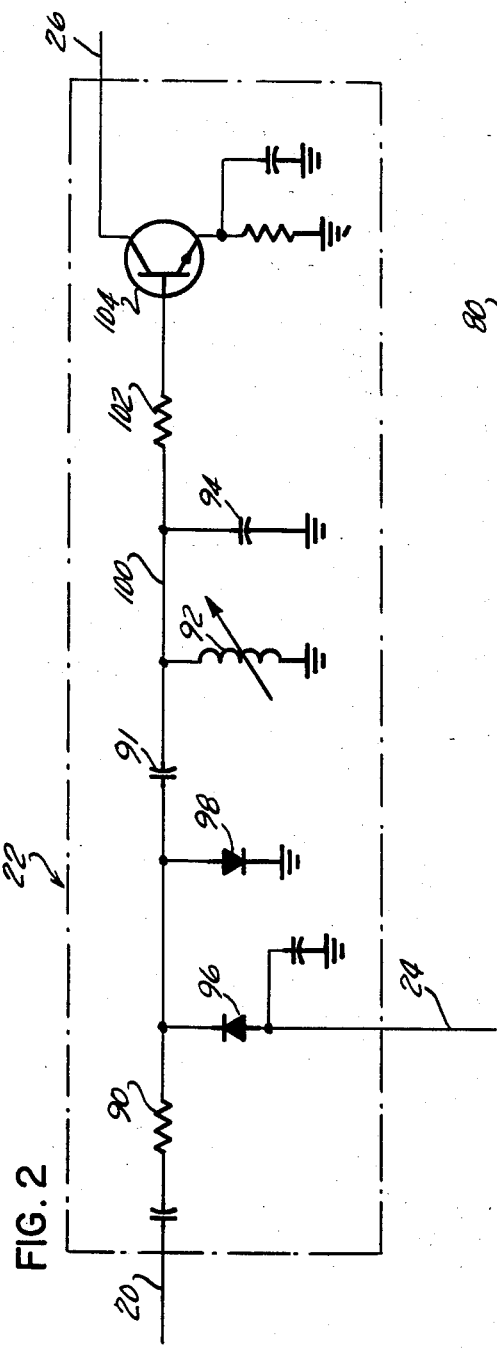
FIG. 2 is a schematic illustration of the vario-losser means forming part of the system of FIG. 1.

Referring to FIG. 2 which illustrates more detail of the vario-losser means 22, a resistor 90 forms one leg of a voltage divider, the other leg of which is coupled to the resistor 90 by a capacitor 91 and comprises a tuned tank in the form of an inductance 92 and a capacitor 94. In parallel with the tuned tank is a vario-losser in the form of diodes 96 and 98, the impedance of which can be changed, in this example, from less than 5 ohms to more than 5000 ohms by changing the current through the diodes from approximately 8 ma to 8 $\mu$amps.

The signal at line 100 between the voltage divider legs is applied via resistor 102 to the base of a transistor 104 which provides gain to the output signal of the vario-losser means 22 on line 26.

The signal at the input 20 to the voltage divider has a bandwidth of approximately 15 Hz at a nominal level of $-20$ dBv. Across the tank circuit the level is maintained at approximately $-43$ dBv. When a strong signal appears in the 15 Hz input band, the AGC system 10 maintains the background noise level across the tank circuit 92, 94 and the vario-losser 96,98 at $-43$ dBv. However, the total energy at this point (line 100) consists of not only the background noise but also the strong signal. For S/N (signal to noise) ratios of $+30$ dB/Hz, the total energy across the vario-losser diodes increases to approximately $-22$ dBv which is strong enough to begin to control the vario-losser diodes and conventional whitening will begin.

Figure 3:
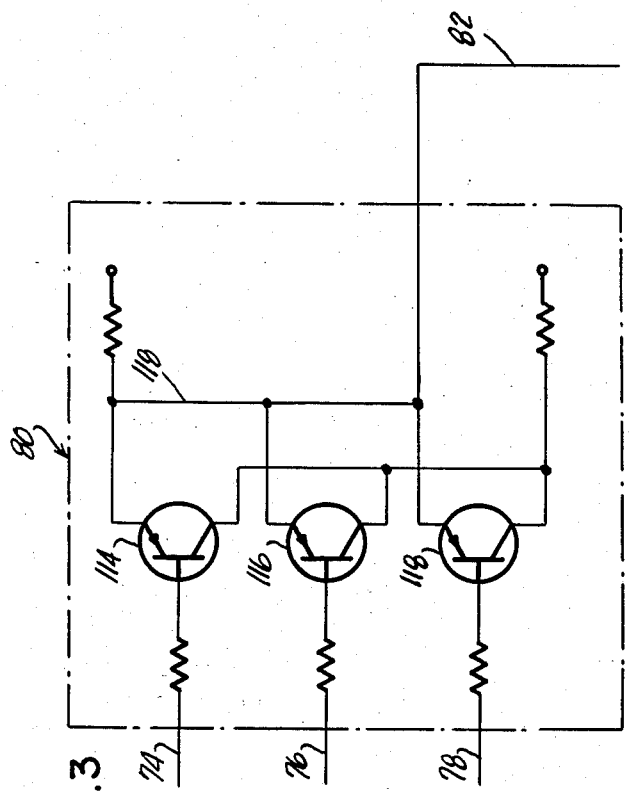
FIG. 3 is a schematic illustration of the electronic selector switch means forming part of the system of FIG. 1.

Referring to FIG. 3, the three inputs, unity gain selector switch 80 conveniently comprises three PNP transistors 114, 116, and 118 which are connected as emitter followers with a common emitter connection 118 from which the output on line 82 is derived. In such a configuration the input on line 74, 76, or 78 with the lowest level will appear at the output.

From this it is apparent that the three AGC filters 40, 42, and 44 should be closely matched so as to insure equal contribution by each of the AGC filter outputs under conditions of no strong signal inputs. Tests indicate that a difference in average D.C. of 0.15 volts (1 dB difference in RF level) between inputs on lines 74, 76, and 78 to the selector switch 80 is not detrimental to the performance of the system.

What is claimed is:

1. An automatic gain control system for use in a low frequency spectrum analyzer of the type having a band pass filter connected to receive RF signals having as components low frequency signals including background signals and higher intensity signals of discrete frequencies, and operative to pass a band of frequencies including a predetermined central frequency of interest, said system comprising:

vario-losser means for receiving signals throughout said band of frequencies and for providing a degree of attenuation of said signals in accordance with a control voltage;

RF amplifier means for receiving attenuated signals from said vario-losser means and for effecting amplification thereof, a portion of the amplified signals being taken as the output of said gain control system;

a plurality of narrow band pass filters for receiving and filtering amplified signals from said RF amplifier means, said filters including ones having peak transmittances close to and on both sides of said frequency of interest;

a plurality of detector means for receiving filtered signals from respective ones of said filter means and for rendering rectification of said filtered signals;

selector switch means for receiving the rectified outputs of each of said detector means and for selectively switching through only the lowest level input from said detector means;

low pass filter means for receiving the output of said selector switch means and for reducing ripple therein; and D.C. amplifier means for receiving and amplifying the output of said low pass filter means to provide said control voltage to said vario-losser means.

2. An automatic gain control system as defined in claim 1, and wherein:

said vario-losser means comprises voltage-divider means including resistor means as one leg and a tuned tank as another leg, and diode means connected in parallel with said tuned tank.

3. An automatic gain control system as defined in claim 2, and wherein:

said plurality of narrow pass filters comprises at least three narrow pass band filters each characterized by a central frequency which differs from said frequency of interest by a predetermined amount.

4. An automatic gain control system as defined in claim 3, and wherein:

said selector switch means comprises a plurality of parallel connected, unity gain amplifier means each receiving signals from a respective one of said detector means.

5. An automatic gain control system as defined in claim 4, and wherein:

said plurality of parallel connected, unity gain amplifier means comprise a plurality of transistors connected as emitter followers.

* * * * *